(12) United States Patent
Tessmer et al.

(10) Patent No.: US 6,790,777 B2
(45) Date of Patent: Sep. 14, 2004

(54) METHOD FOR REDUCING CONTAMINATION, COPPER REDUCTION, AND DEPOSITING A DIELECTRIC LAYER ON A SEMICONDUCTOR DEVICE

(75) Inventors: Glenn J. Tessmer, Richardson, TX (US); Ju-Ai Ruan, Plano, TX (US); Mercer Lusk Brugler, Flower Mound, TX (US); Sarah Hartwig, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 37 days.

(21) Appl. No.: 10/288,717
(22) Filed: Nov. 6, 2002
(65) Prior Publication Data
US 2004/0087149 A1 May 6, 2004

(51) Int. Cl.[7] .............................................. H01L 21/44
(52) U.S. Cl. ...................... 438/687; 438/694; 438/710; 438/906; 438/913; 438/974
(58) Field of Search ................................ 438/687, 694, 438/913, 906, 974, 706, 710

(56) References Cited

U.S. PATENT DOCUMENTS

| | | | | |
|---|---|---|---|---|
| 5,174,881 A | * | 12/1992 | Iwasaki et al. | ........ 204/298.25 |
| 6,069,096 A | * | 5/2000 | Nishihata et al. | .......... 29/25.01 |
| 6,176,667 B1 | * | 1/2001 | Fairbairn et al. | ........... 414/217 |
| 6,355,571 B1 | | 3/2002 | Huang et al. | |
| 6,365,518 B1 | | 4/2002 | Lee et al. | |
| 6,376,387 B2 | * | 4/2002 | Carlson et al. | ............. 438/716 |
| 2001/0049181 A1 | | 12/2001 | Rathi et al. | |
| 2002/0127843 A1 | | 9/2002 | Noguchi et al. | |
| 2002/0187635 A1 | * | 12/2002 | Pyo et al. | ................... 438/680 |

* cited by examiner

Primary Examiner—Maria Guerrero
(74) Attorney, Agent, or Firm—Jacqueline J. Garner; W. James Brady, III; Frederick J. Telecky, Jr.

(57) ABSTRACT

The present invention relates to a method for improving an interface of a semiconductor device. The method comprises providing a first and second substrate having an oxidized region, and establishing a first loading position in a first process chamber. The first and second substrates are consecutively inserted into the first process chamber and generally simultaneously processed, wherein the oxidized region is reduced by exposure to a first plasma. The first and second substrates are then consecutively removed and the first substrate is inserted into a second process chamber and subsequently processed. The second substrate is then inserted into the second process chamber and the first and second substrates are simultaneously processed. The first substrate is the removed, and the second substrate is processed again. According to one exemplary aspect, the first and second substrates are exposed to a first temperature in the first process chamber for approximately half the time the first and second substrates are exposed to a higher second temperature in the second process chamber while maintaining throughput of substrates.

47 Claims, 11 Drawing Sheets

| | Process Parameters | | | |
|---|---|---|---|---|
| | | General | Prefered | Most prefered | Units |
| Pretreat | | | | | |
| | NH3 flow | 500 - 8000 | 750 - 4000 | 1000 - 3000 | sccm |
| | N2 flow | 500 - 8000 | 500 - 4000 | 500 - 2500 | sccm |
| | High Frequency Power | 400 - 1800 | 400 - 800 | 500 - 700 | Watts |
| | Low Frequency Power | 0 - 900 | 100 - 500 | 200 - 400 | Watts |
| | Pressure | 1 - 10 | 1.5 - 3.5 | 2.0 - 3.0 | Torr |
| | Temperature | 100 - 425 | 250 - 400 | 275 - 350 | C |
| Deposition | | | | | |
| | SiH4 flow | 100 - 600 | 300 - 600 | 400 - 600 | sccm |
| | NH3 flow | 10 - 600 | 300 - 600 | 500 - 600 | sccm |
| | N2 flow | 0 - 18000 | 0 - 3000 | 2000 - 3000 | sccm |
| | High Frequency Power | 0 - 1100 | 200 - 1100 | 500 - 800 | Watts |
| | Low Frequency Power | 0 - 900 | 40 - 700 | 200 - 400 | Watts |
| | Pressure | 1-10 Torr | 1.5 - 3.5 | 2.0 - 3.0 | Torr |
| | Temperature | 100 - 425 | 275 - 400 | 300 - 400 | C |

FIG. 8

METHOD FOR REDUCING CONTAMINATION, COPPER REDUCTION, AND DEPOSITING A DIELECTRIC LAYER ON A SEMICONDUCTOR DEVICE

TECHNICAL FIELD OF INVENTION

The present invention relates generally to fabrication of semiconductor devices, and more particularly to reducing contamination, electromigration, and corrosion of conductive material during fabrication thereof.

BACKGROUND OF THE INVENTION

Integrated circuits fabricated on semiconductor substrates for Ultra Large Scale Integration (ULSI) require multiple levels of conductive interconnections for electrically connecting the discrete semiconductor devices that comprise the circuits. Conventionally, the multiple levels of interconnections are separated by layers of insulating material. These interposed insulating layers typically have etched via holes which are used to electrically connect one level of metal to another. Typically, the conductive interconnection material is aluminum, titanium, tungsten or tantalum. As device dimensions decrease and device densities increase, however, conductive materials having lower resistivity, such as copper, are employed.

One well-known method for creating integrated circuits such as those described above is by chemical vapor deposition (CVD). Typically, a precursor gas is mixed with a carrier gas and introduced to a deposition chamber at an elevated temperature. Upon contact with a substrate (e.g., a semiconductor wafer) within the chamber, the precursor gas decomposes into various elements and reacts with the surface to create the desired material (e.g., an insulative layer such as an oxide, or conductive material such as copper). Such processes may also be enhanced by the use of a plasma within the chamber which provides for a more uniform deposition process, for example, when filling an opening in an oxide layer with conductive material. However, deficiencies in the CVD process may create undesirable results. It has been found typically that between the time that a conductive material is deposited upon the substrate and an insulative or barrier layer is deposited over the conductive material, the conductive material is subjected to an oxidation reduction reaction. For example, the topmost exposed surface of a copper interconnect is reduced to copper oxide. Such surface oxides inhibit the adhesion of further material layers (e.g., an insulative layer such as a nitride layer) that are deposited thereover.

One particular method known in the art for removing native oxides from conductive interconnects is by chemical removal of the native oxide. One conventional method for chemically removing an oxide from a copper layer is illustrated in FIG. 1, and includes the use of a hydrogen-based plasma. According to the conventional method 100, a semiconductor substrate is inserted into a process chamber at a predetermined temperature at 105. Chemically-reactive oxide-reducing gases such as ammonia ($NH_3$) or hydrogen ($H_2$) are then introduced into the process chamber at 110, and an oxide-reducing plasma is initiated by an application of a first RF power to the hydrogen-based oxide-reducing gases at 115. The oxide-reducing plasma chemically reacts with the oxide, and reduces the oxide to form copper (Cu) and byproducts (e.g., water ($H_2O$) and hydroxide (OH)). These byproducts are then pumped out of the process chamber.

Nitride-forming gases, such as a mixture of silane ($SiH_4$), ammonia ($NH_3$) and nitrogen ($N_2$), are subsequently introduced into the same process chamber at 120, and the first RF power is changed to a suitable second RF power at 125, thereby forming a second plasma suitable for CVD of a nitride layer over the copper. Following the formation of the nitride layer, the substrate is removed from the process chamber at 130.

Unfortunately, the conventional method 100 has several disadvantages. For example, adhesion of the nitride layer to the copper layer is adversely affected during this process because the silane may react with residual water or hydroxide that was not evacuated from the chamber. Such a reaction causes an undesirable hazy film to form over the conductive interconnect, thereby decreasing adhesion of the nitride layer to the underlying copper. Furthermore, a processing temperature in the chamber typically remains substantially constant, wherein hillock growth in the copper layer is accentuated by reducing the copper oxide at a temperature typically suited to the nitride deposition, thereby causing further undesirable effects in later depositions. Additionally, the copper and silane thermally react to form copper silicides ($CuSi_x$) when the plasma is turned off in preparation for subsequent process steps. Either of these films are undesirable for further depositions. Furthermore, modifying the RF power at 125 appears to induce plasma damage and antenna damage, and has deleterious effects on gate oxide integrity (GOI).

Therefore, there is a need in the art for a method of semiconductor device construction that reduces the amount of native oxide formation on the conductive material used to form the device, wherein the method mitigates the deleterious effects associated with conventional techniques.

SUMMARY OF THE INVENTION

The following presents a simplified summary of the invention in order to provide a basic understanding of some aspects of the invention. This summary is not an extensive overview of the invention. It is intended to neither identify key or critical elements of the invention nor delineate the scope of the invention. Its purpose is to present some concepts of the invention in a simplified form as a prelude to the more detailed description that is presented later.

The present invention relates generally to improving an interface of a semiconductor substrate, and more specifically to a method of reducing an oxide formed over a metal layer and depositing a dielectric layer over said metal layer. The metal layer, for example, comprises a copper layer, wherein a native copper oxide is formed by oxidation of the metal layer. The dielectric layer, for example, comprises a nitride layer which is formed over the copper metal layer.

According to one exemplary aspect of the present invention, a method for improving an interface is provided, wherein two or more semiconductor substrates such as silicon wafers are provided, whereon a first layer has been formed. The first layer, for example, comprises a metal layer such as copper, wherein the first layer furthermore comprises an oxidized region. A first and second semiconductor substrate are consecutively inserted into a first process chamber, such as a plasma-enhanced chemical vapor deposition (PECVD) chamber, when the first process chamber is in a first loading position. A first processing position is then established, wherein the first and second substrates are processed. The first and second substrates are generally simultaneously subjected to a first temperature for a first predetermined period of time. The first and second substrates, for example, are placed on a first heated disk, wherein the substrates are subjected to the first temperature for a first soak time.

After the first soak time has generally elapsed, a first plasma is subsequently introduced into the first process chamber, wherein the first plasma is energized by a first predetermined power for a second predetermined period of time, thereby generally simultaneously chemically reducing the oxidized region of the first layer on the first and second substrates. The first loading position is then established again, and the first and second substrates are consecutively removed from the first process chamber.

According to one exemplary aspect of the present invention, prior to removing the first and second substrates from the first process chamber, a third and fourth substrate are consecutively inserted into the first process chamber when the first process chamber is in the first loading position, and the first processing position is again established. The first, second, third, and fourth substrates are then simultaneously processed in a manner similar to the previous processing of the first and second substrates, wherein the first and second substrates are processed a second time. According to another exemplary aspect of the present invention, the first loading position is again established after the first, second, third, and fourth substrates are processed, and a fifth and sixth substrate are consecutively inserted into the first process chamber. The first processing position is again established, and the first, second, third, fourth, fifth, and six substrates are then simultaneously processed in a manner again similar to the previous processing of the first and second substrates, wherein the first and second substrates are processed a third time and the third and fourth substrates are processed a second time. The first loading position is then established again for the consecutive removal of the first and second substrates from the first process chamber.

According to another exemplary aspect of the present invention, following the removal of the first and second substrates in the first process chamber, the first substrate is inserted into a second process chamber (e.g, a PECVD chamber) when the second process chamber is in a second loading position. A second processing position is subsequently established after insertion of the first substrate, wherein the first substrate is subjected to a second temperature for a third predetermined period of time in the second process chamber. For example, the first substrate is placed on a second heated disk, wherein the first substrate is subjected to the second temperature for a second soak time.

After the second soak time has generally elapsed, a second plasma is then introduced into the second process chamber, wherein the second plasma is energized by a second predetermined power for a fourth predetermined period of time, thereby forming a second layer over the first layer. The second layer, for example, comprises a generally insulative layer such as a nitride layer. The second loading position is then reestablished, and the second substrate is also inserted into the second process chamber. The second process position is then reestablished, and the first and second substrates are generally simultaneously processed in a similar manner as the first substrate was previously processed in the second process chamber, thereby forming the second layer over the first layer on the first and second substrates. The second loading position is then established again.

According to one exemplary aspect of the present invention, the first substrate is removed from the second process chamber, and the second processing position is again established. The second substrate is again processed in a similar manner as the second first and second substrates were previously processed in the second process chamber, thereby forming the second layer over the first layer on the second substrate. Accordingly, the interface between the first layer and the second layer on the first and second substrates has been improved. According to another exemplary aspect of the present invention, the third, fourth, fifth, and sixth substrates are consecutively inserted into the second process chamber prior to removing the first or second substrates, and the substrates are processed in a similar manner as the second first and second substrates were previously processed.

According to another exemplary aspect of the present invention, each substrate is placed on one of a plurality of first substrate supports when it is placed in the first process chamber, wherein the plurality of substrate supports are operable to vertically translate, thereby vertically translating the substrate placed thereon. For example, the substrate is placed on one of the plurality of supports in a first position when the substrate is placed in the first process chamber, and is subsequently lowered via translating the substrate supports to a second position, wherein contact between the substrate and the first heated plate is established, thereby subjecting the substrate to the first temperature. According to still another exemplary aspect of the invention, the plurality of first supports are operable to rotate about a first axis when in the first position, wherein the first substrate placed on one of the first supports is operable to be rotated to another position associated with the first heated disk. According to yet another exemplary aspect of the invention, the second substrate is consecutively placed on another one of the plurality of first supports prior to the plurality of first supports being lowered to the second position.

Consecutively inserting two or more substrates into the first process chamber significantly limits an amount of time at which the two or more substrates are exposed to the first temperature, thereby advantageously limiting a growth of hillocks in the first layer. According to another exemplary aspect of the invention, the first and second substrates are sequentially processed in the second process chamber, wherein the third predetermined time at which the first and second substrates are subjected to the second temperature is approximately double the first predetermined time at which the first and second substrates are subjected to the first temperature.

According to another exemplary aspect of the present invention, the substrate is subjected to a first temperature in the first process chamber which is lower than the second temperature in the second process chamber. Furthermore, according to still another exemplary aspect of the present invention, deleterious effects associated with transitory RF power of prior art techniques are eliminated by subjecting the substrate a first RF power in the first process chamber and a second RF power in the second process chamber.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

FIG. 8 is a chart illustrating exemplary process parameters according to another exemplary aspect of the present invention.

DETAILED DESCRIPTION OF THE INVENTION

Figure 1:
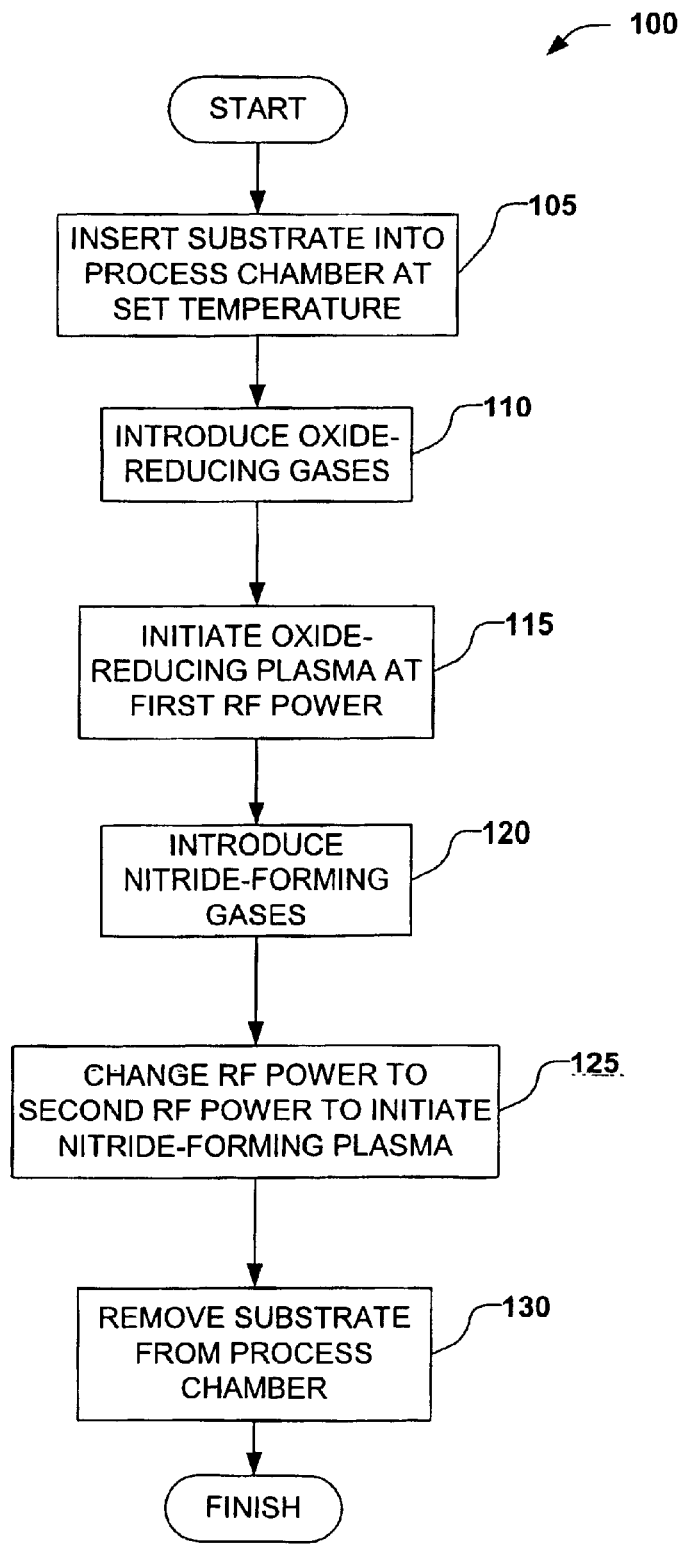
FIG. 1 illustrates a method of reducing an oxide according to the prior art.

The present invention will now be described with reference to the drawings wherein like reference numerals are used to refer to like elements throughout. It should be understood that the description of these aspects are merely illustrative and that they should not be taken in a limiting sense. In the following description, for purposes of explanation, numerous specific details are set forth in order to provide a thorough understanding of the present invention. It will be evident to one skilled in the art, however, that the present invention may be practiced without these specific details.

The present invention is directed toward a method of improving an interface of a semiconductor device. More particularly, the present invention relates to an interface between a first layer and a second layer formed over a semiconductor substrate, wherein the interface is defined as a region where the first layer and the second layer generally meet. Improving the interface between the first layer and the second layer will advantageously affect subsequent depositions, as will be discussed hereafter.

Figure 2:
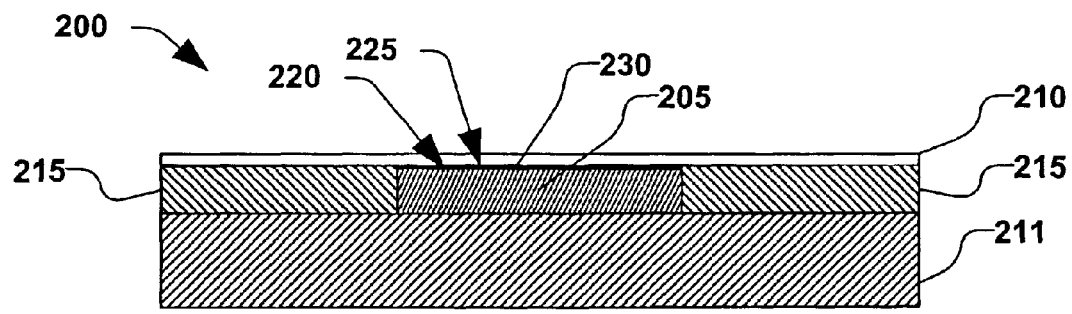
FIG. 2 illustrates a partial cross-sectional view of an exemplary substrate comprising a first layer and a second layer formed thereon according to the present invention.

Referring now to the figures, FIG. 2 illustrates a partial cross-sectional view of an exemplary semiconductor device 200 comprising a first layer 205 and a second layer 210 formed over a semiconductor substrate 211 (e.g., a silicon wafer). For example, the first layer 205 may comprise an electrically conductive metal layer such as copper, and the second layer 210 may comprise an electrically insulative layer such as a nitride. Alternatively, the first layer 205 may comprise other conductive layers such as Al, Ti, TiN, Ta, TaN. Furthermore, the first layer 205 may be utilized as a conductive line or interconnect connecting two or more devices (not shown) formed over the substrate 211, and may be further laterally bounded by an insulative layer 215. The second layer 210, for example, may be a dielectric layer utilized as an etch stop for subsequent etch processes (e.g., a nitride). A region 220 between first layer 205 and the second layer 210 where the first layer and the second layer generally meet is defined as an interface 225. The interface 225 can be affected by a native growth of an oxide 230 on the first layer 205, as well as by other processes performed in forming the semiconductor device, as will become apparent to one of ordinary skill in the art.

Conventionally, wherein the first layer 205 comprises copper, the oxide 230 is reduced prior to depositing the second layer 210 in order to increase adhesion of the second layer to the first layer. By introducing a hydrogen-based plasma to the substrate 211, the oxide 230 is reduced to form copper, water, and hydroxide. After the oxide 230 is reduced, the second layer 210 is formed over the first layer 205, for example, by a plasma-enhanced chemical vapor deposition (PECVD) of a nitride such as silicon nitride. A conventional method of reducing the oxide 230 and forming the second layer 210 over the first layer 205, for example, comprises performing two plasma operations in a single process chamber (not shown). The exemplary conventional method comprises introducing a first plasma at a first RF power into the process chamber for the reduction of the oxide 230, and then introducing a second plasma at a second RF power which is lower than the first RF power into the same chamber to form the second layer 210. It has been discovered, however, that changing the RF power in the same chamber can be linked with transitory power anomalies which are believed to cause gate oxide integrity (GOI) and antenna structure damage at other locations on the substrate 211.

Figure 3:
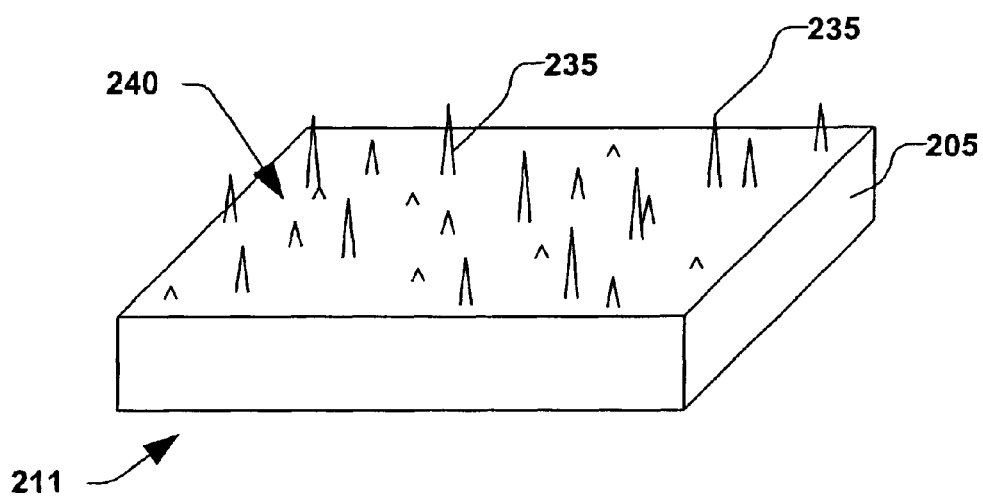
FIG. 3 illustrates a perspective view of an exemplary first layer comprising hillocks.

Furthermore, conventional methods of reducing the oxide 230 and forming the second layer 210 typically comprise heating the substrate 211 on a heated platen (not shown) prior to introducing the first and second plasmas (typically called a "pretreat"), wherein the substrate is heated to a predetermined temperature, typically around 400° C. While such heating is typically a necessity in the reduction of the oxide 230, it can also cause problems such as the growth of hillocks in the first layer 205. FIG. 3 illustrates an exemplary first layer 205, wherein hillocks 235 have grown upward from a surface 240 of the first layer. It has also been found that hillocks 235 tend to appear on the surface 240 of first layers 205 comprising a metal such as copper at higher substrate temperatures (e.g., at approximately 400° C.) and larger RF powers, or when the substrate 211 is subjected to the predetermined temperature or RF power for a substantially long treatment time.

Figure 4:
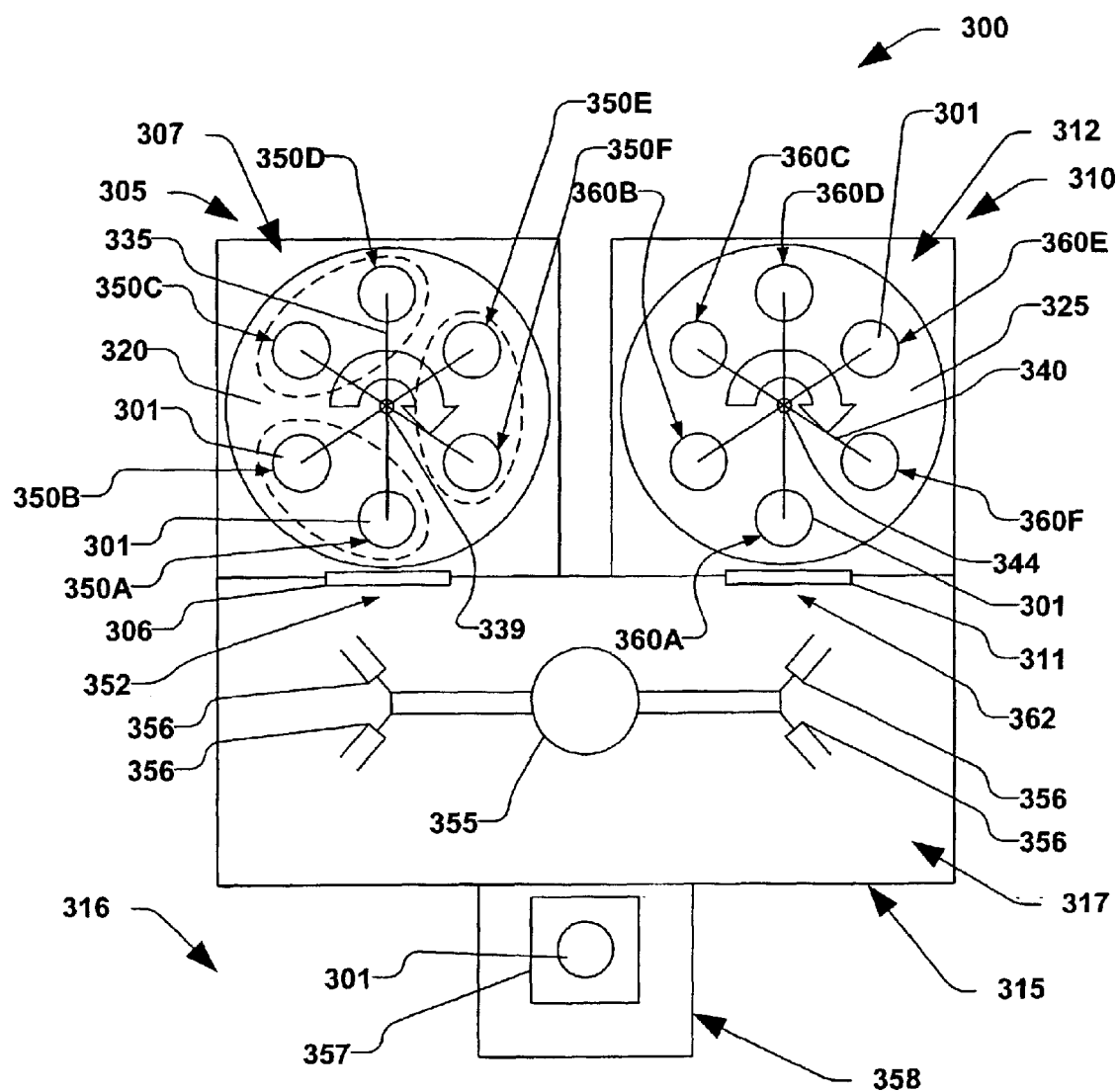
FIG. 4 illustrates a simplified plan view of an exemplary system for reducing an oxide according to the present invention.

Therefore, since the above problems have been identified and appreciated by the inventor, it has been determined that decreasing the predetermined temperature at which the oxide is reduced, as well as decreasing the treatment time at the decreased predetermined temperature will advantageously decrease a growth of hillocks in the first layer 205. According to one exemplary aspect of the present invention, a system comprising two process chambers is disclosed, within which the interface 225 between the first layer 205 and the second layer 210 of FIG. 2 is improved. FIG. 4 illustrates a plan view of an exemplary system 300 for improving the interface (not shown) of a semiconductor device (not shown) formed on a substrate 301. The system 300, for example, comprises a first process chamber 305 and a second process chamber 310, wherein the first process chamber and the second process chamber are coupled by transfer chamber 315. The transfer chamber 315, for example, is operable to environmentally isolate the first process chamber 305 from the second process chamber 310, and is further environmentally isolated from an external environment 316 (e.g., atmosphere), thereby defining a transfer environment 317. Preferably, the transfer environment 317 comprises a vacuum.

The first process chamber 305 and second process chamber 310, for example, each comprise a PECVD chamber, and furthermore comprise a first gate valve 306 and second gate valve 311, respectively. The first gate valve 306 and second gate valve 311 generally separate the first process chamber 305 and the second process chamber 310 from the transfer chamber 315, respectively, wherein a first environment 307 in the first process chamber, and a second environment 312 in the second process chamber can be separately maintained. Furthermore, the first gate valve 306 and second gate valve 311 selectively permit a transfer of a substrate 301 between the first process chamber 305 and the transfer chamber 315, and the second process chamber 310 and the transfer chamber, respectively, wherein the first environment 307 and the second environment 312 are generally separately maintained.

According to another exemplary aspect of the present invention, the first process chamber 305 and second process chamber 310 comprise a first heated disk 320 and second heated disk 325, respectively, wherein the first heated disk and second heated disk are operable to maintain a first temperature $T_1$ and a second temperature $T_2$, respectively. The first heated disk 320 and second heated disk 325, for example, each comprise a resistively heated aluminum block 330, wherein a thickness (not shown) of the aluminum block is sufficient to generally maintain the first temperature $T_1$ and second temperature $T_2$.

According to yet another exemplary aspect of the present invention, the first process chamber 305 and second process chamber 310 comprise a plurality of first supports 335 and a plurality of second supports 340, respectively. The plurality of first supports 335 and plurality of second supports 340 are furthermore vertically moveable, as illustrated in cross-section in FIG. 5. For example, the first plurality of supports 335 are vertically moveable between a first position 336 generally at or below a first surface 337 of the first disk 320 and a second position 338 generally above the first surface of the first disk. The plurality of first supports 335 are furthermore operable to support a respective plurality of substrates 301, and to place the respective plurality of substrates on the first surface 337 of the first disk 320 during a translation of the plurality of first supports from the second position 338 to the first position 336. Likewise, the second plurality of supports 340, for example, are vertically moveable between a third position 341 generally at or below a second surface 342 of the second disk 325 and a fourth position 343 generally above the second surface of the second disk. The plurality of second supports 340 are furthermore operable to support a respective plurality of substrates 301, and to place the respective plurality of substrates on the second surface 342 of the second disk 325 during a translation of the plurality of second supports from the fourth position 343 to the third position 341. Each of the plurality of first supports 335 and plurality of second supports 340, for example, are furthermore operable to rotate about a first axis 339 and a second axis 344, respectively.

Figure 6A:
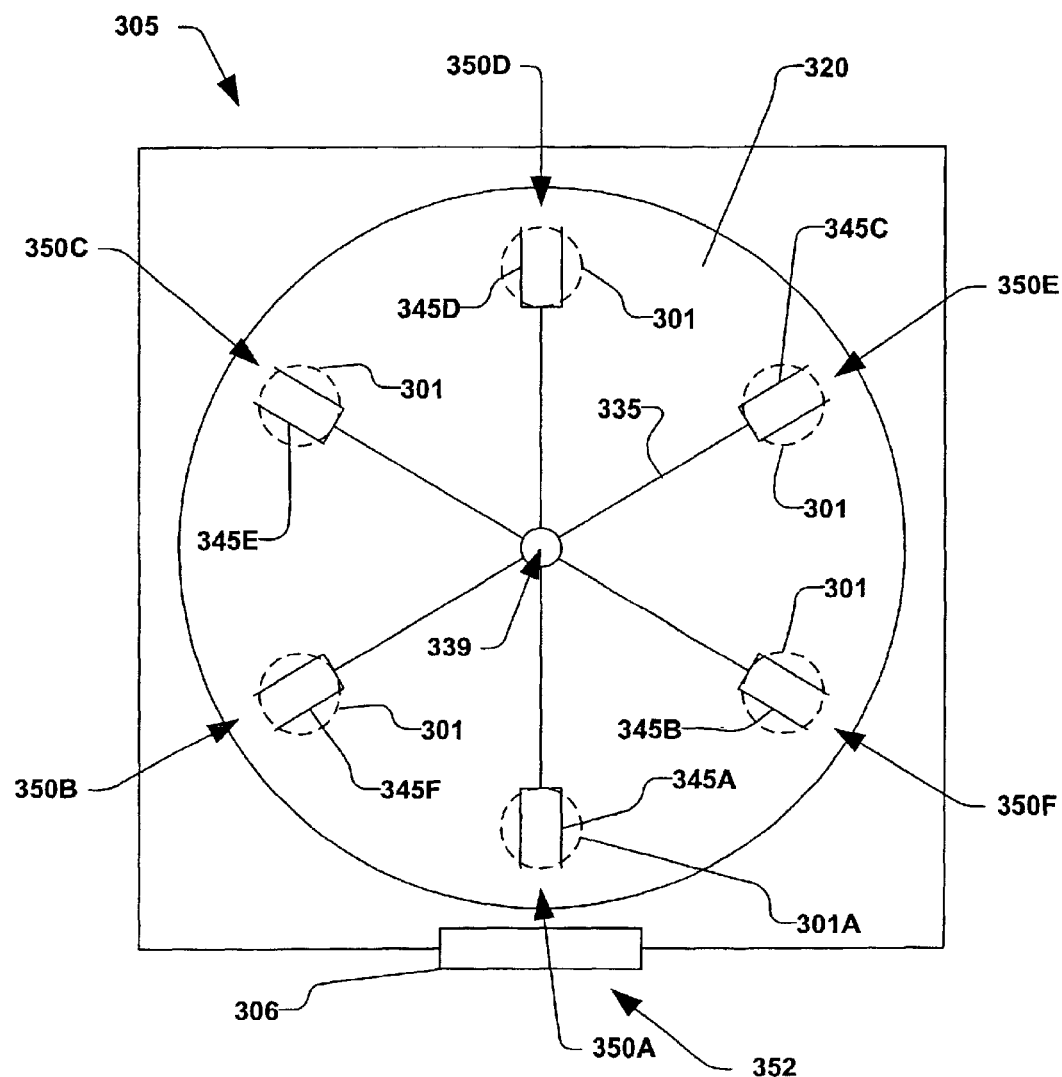
FIGS. 6A–6B illustrate simplified plan views of an exemplary first process chamber according to the present invention.
Figure 6B:
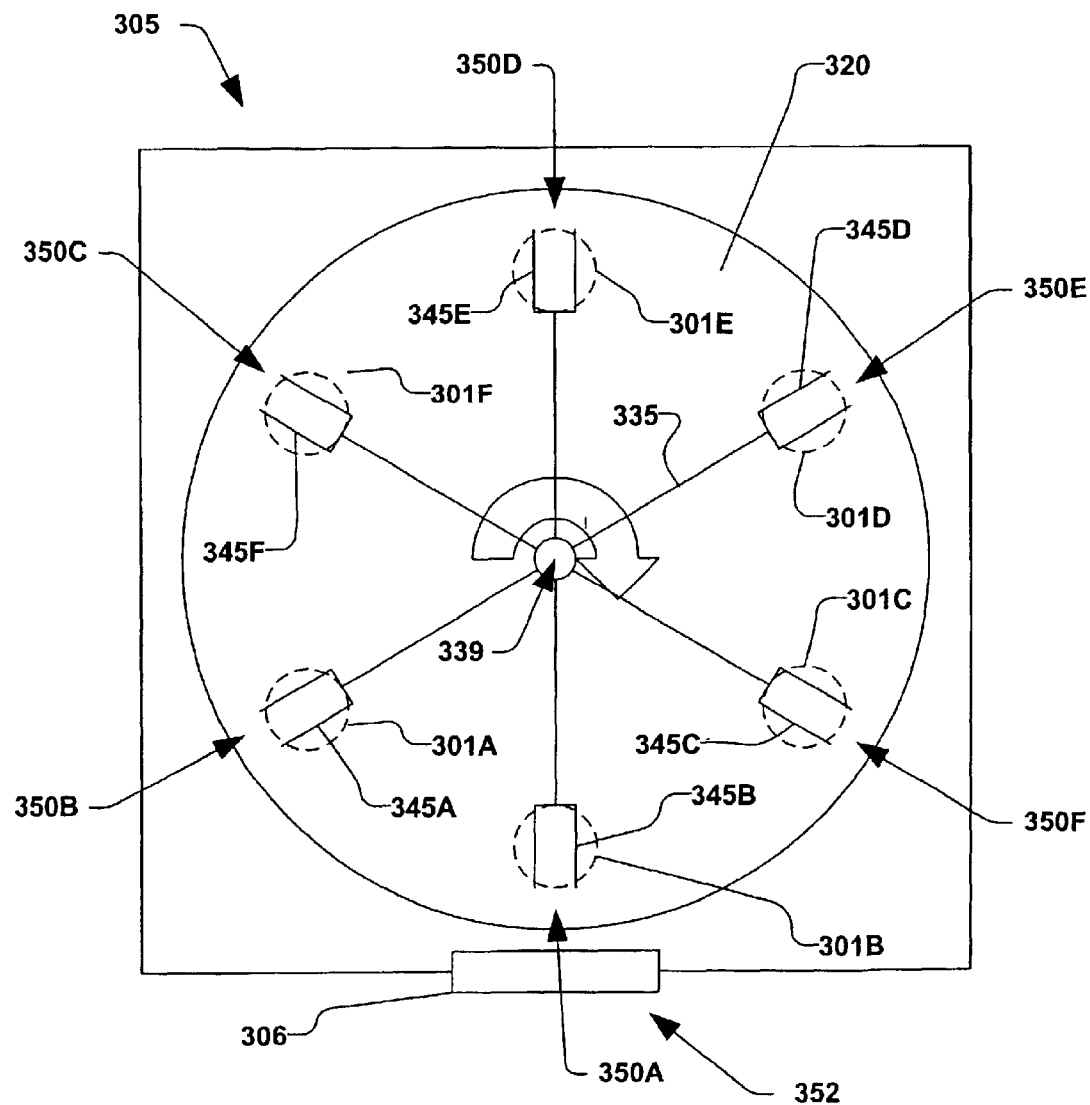
Figure 6C:
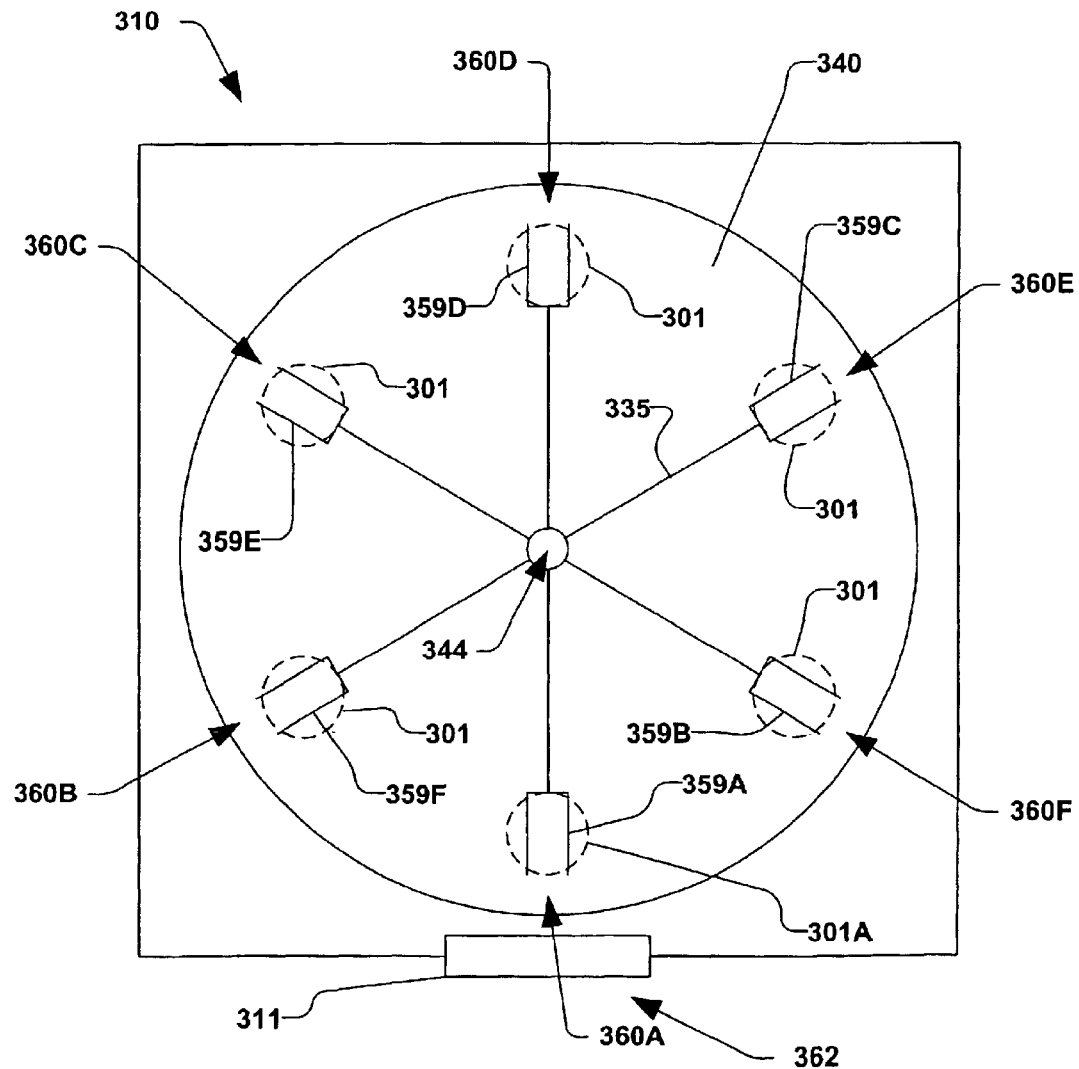
FIGS. 6C–6D illustrate simplified plan views of an exemplary second process chamber according to the present invention.
Figure 6D:
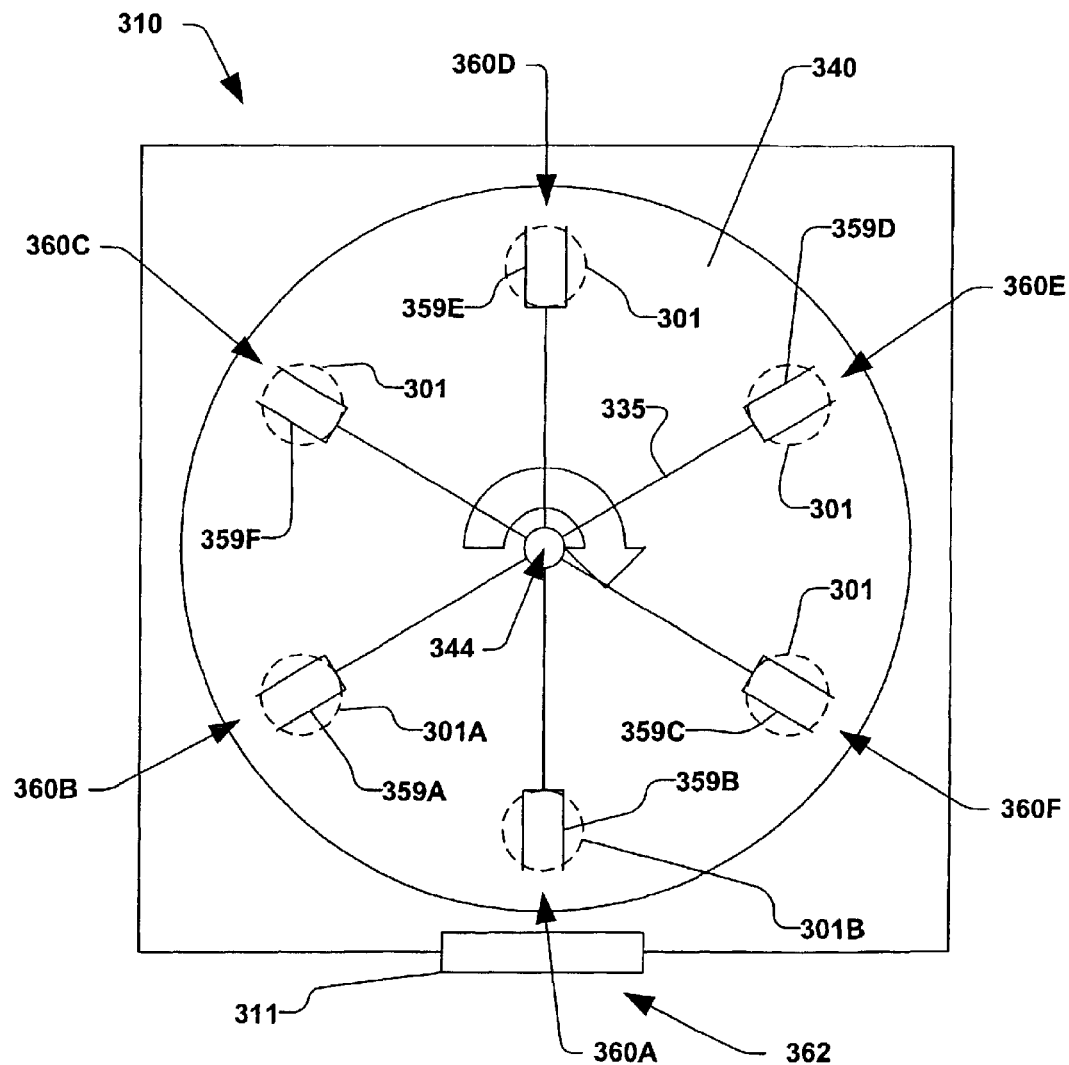

FIGS. 6A–6B illustrate a plan view of an exemplary first process chamber 305 comprising a plurality of first supports 335, and FIGS. 6C–6D illustrate a plan view of an exemplary second process chamber 310 comprising a plurality of second supports 340. As will be understood by one of ordinary skill in the art, the first process chamber 305 of FIGS. 6A–6B, for example, can be considered analogous to the second process chamber 310 of FIGS. 6C–6D, and therefore. Referring again to FIG. 6A, each of the plurality of first supports 335 associated with the first process chamber 305 comprise a substrate effector 345 operable to support one of the substrates 301. The plurality of first supports 335, for example, are operable to rotate about the first axis 339 a predetermined amount (e.g., one-sixth of a revolution), wherein the plurality of first supports 335 are operable to translate a substrate 301A residing on a first end effector 345A at a first station 350A to a second station 350B when the plurality of first supports 335 are in the second position (not shown). As will be understood by one of ordinary skill in the art, the substrate 301A may be further translated to the third station 350C, and so on, by further rotations of the plurality of first supports 335 by the predetermined amount, whereby the substrate 301A will eventually return to the first station 350A.

According to another exemplary aspect of the present invention, a method for improving an interface between the first layer and the second layer of a semiconductor device is disclosed using, for example, the system of FIGS. 4–6D. While exemplary methods are illustrated and described herein as a series of acts or events, it will be appreciated that the present invention is not limited by the illustrated ordering of such acts or events, as some steps may occur in different orders and/or concurrently with other steps apart from that shown, and described herein, in accordance with the invention. In addition, not all illustrated steps may be required to implement a methodology in accordance with the present invention. Moreover, it will be appreciated that the methods may be implemented in association with the apparatus and systems illustrated and described herein as well as in association with other systems not illustrated.

Figure 5:
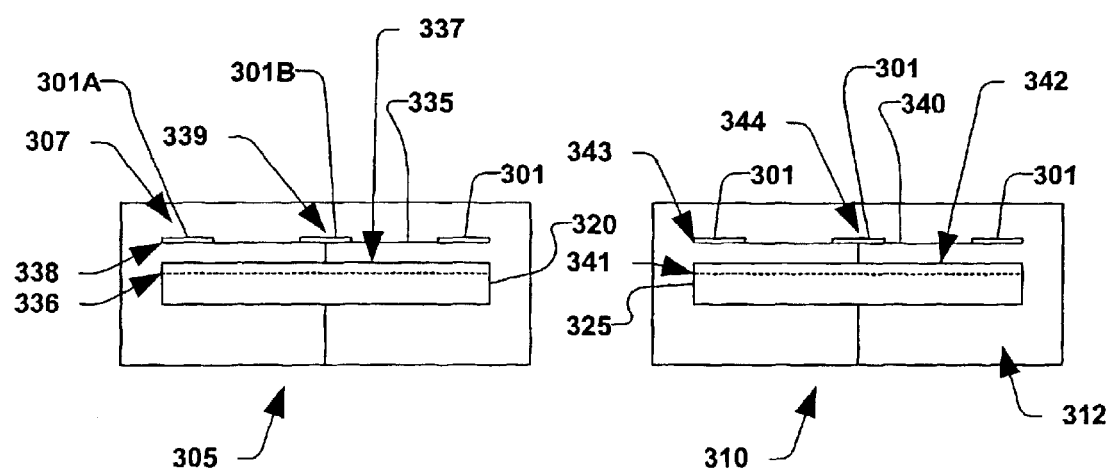
FIG. 5 illustrates a partial cross-sectional view of the first process chamber and second process chamber of FIG. 4.
Figure 7A:
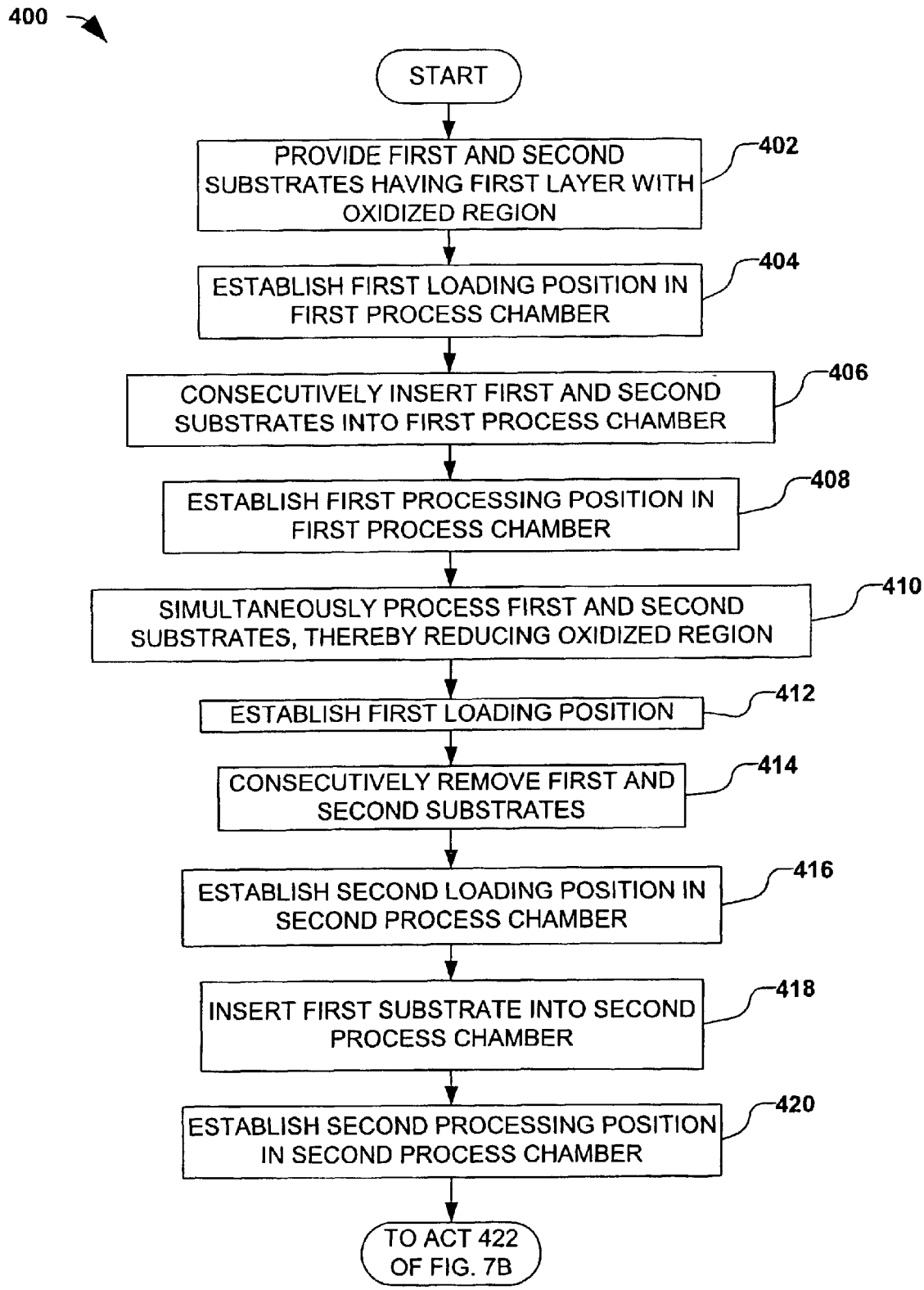
FIGS. 7A–7B illustrate a method of improving an interface according to one exemplary aspect of the present invention.
Figure 7B:
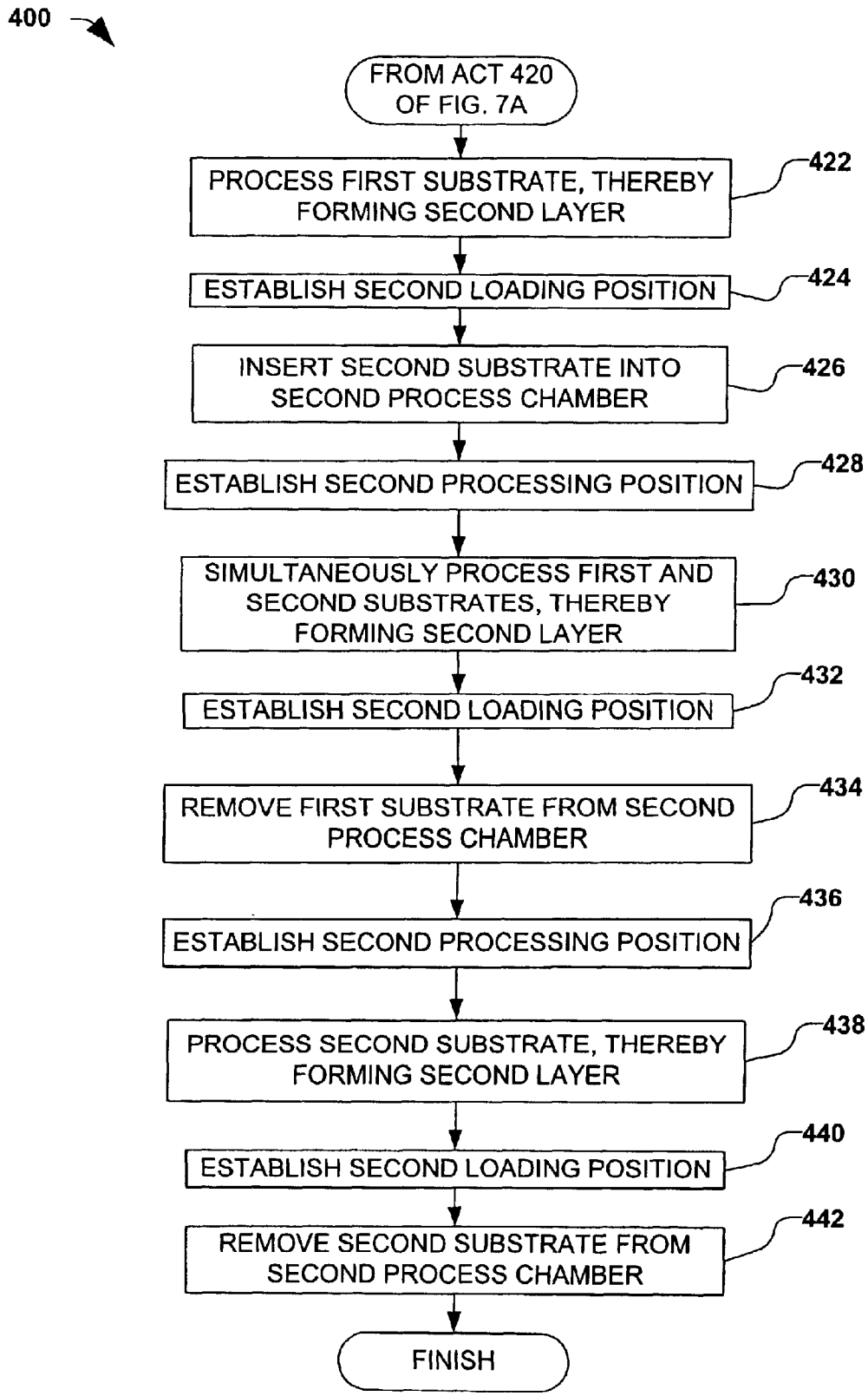

FIGS. 7A–7B illustrate an exemplary method 400 for improving the interface, wherein an oxidized region of the first layer formed on a semiconductor substrate is reduced prior to forming the second layer thereover. The method 400, as illustrated in FIG. 7A begins at 402, wherein a first semiconductor substrate and a second semiconductor substrate are provided, and wherein each of the first substrate and the second substrate comprise a first layer having an oxidized region formed thereon. A first loading position is established in the first process chamber at 404, wherein, for example, as illustrated in FIG. 5, the plurality of first supports 335 are raised from the first position 336 to the second position 338. Act 406 of FIG. 7A illustrates consecutively inserting the first substrate and the second substrate into the first process chamber when the first process chamber is in the loading position.

Act 406, for example, comprises placing the first substrate and the second substrate on a respective two of the plurality of first supports. As illustrated in FIG. 6A, for example, act 406 may be performed by placing the first substrate 301A on the first end effector 345A associated with the plurality of first supports 335, when the first end effector 345A is at the first station 350A in the first process chamber 305. The first station 350A is furthermore considered a first loading location 352 for the first process chamber 310. As illustrated in FIG. 4, the first substrate 301A is placed on the first support 335, for example, via a robot 355, wherein the robot is equipped with one or more robot end effectors 356. According to one example, the robot 355 removes the first semiconductor substrate 301A from a cassette 357 in a load lock chamber 358, and inserts the first substrate into the first process chamber 310 via the first gate valve 306, and places the substrate on the first support 335 at the first loading location 352.

The plurality of first supports 335 are then rotated (e.g., a clockwise rotation of one-sixth of a revolution) about the first axis 339, wherein the first substrate 301A is translated to the second station 350B. As illustrated in FIG. 6B, the second substrate 301B is then placed on the second end effector 345B when the second end effector is at the first station 350A (e.g., at the first loading location 352). As will be understood by one of ordinary skill in the art, further substrates 301 may be placed on further end effectors 345 after further subsequent rotations of the plurality of first supports, and such insertions of further substrates into the first process chamber at 406 of FIG. 7A are contemplated as falling within the scope of the present invention.

Referring again to FIG. 7A, the method 400 continues at 408, wherein a second processing position is established in the first process chamber after the two wafers have been consecutively introduced into the chamber. Establishing the second processing position, as illustrated in FIG. 5, for example, comprises lowering the plurality of first supports 335 from the second position 338 to the first position 336, wherein the first substrate 301A and the second substrate 301B generally contact the first surface 337 of the first heated disk 320.

Act 410 of FIG. 7A comprises generally simultaneously processing the first substrate and the second substrate, wherein the oxidized region is generally reduced. Generally simultaneously processing the first substrate and the second substrate comprises, for example, subjecting the first and second substrates to a first temperature by thermal conduction from the first disk for a first predetermined period of time. Subjecting the first and second substrates to the first temperature furthermore comprises a first soak time, wherein the first and second substrates are allowed to "soak" at the first temperature prior to further processing (e.g., prior to subjecting the first and second substrates to a plasma). The first soak time, for example, ranges between 2 and 5 seconds, and is preferably approximately 2.5 seconds. Furthermore, the first temperature at which the first and second substrates are subjected for the first predetermined period of time ranges between 275° C. and 400° C., and is preferably approximately 350° C.

Generally simultaneously processing the first substrate and the second substrate at 410 furthermore comprises, for example, introducing a first gas into the first process chamber, and exciting the first gas with a first predetermined power, thereby forming the first plasma for a second predetermined period of time. According to one exemplary aspect of the invention, introducing the first gas comprises flowing one or more of nitrogen or ammonia gases at a first predetermined flow rate. The first gas, for example, may furthermore be flowed into the first process chamber concurrently with the first soak time, however the first gas is generally not excited until the first soak time has elapsed.

The first plasma is formed, for example, by exciting the first gas with a first predetermined power. The first predetermined power furthermore comprises, for example, a high frequency power and a low frequency power, as will be understood by one of ordinary skill in the art. According to one exemplary aspect of the present invention, the high frequency power, for example, ranges between 500 watts and 700 watts, and is preferably approximately 650 watts. The low frequency power, for example, ranges between 200 watts and 400 watts, and is preferably approximately 200 watts. According to yet another exemplary aspect of the present invention, the first predetermined power remains generally constant during excitation of the first gas, thus minimizing power transients which may cause antenna or GOI damage, as will be understood by one of ordinary skill in the art. The first plasma is formed, for example, by exciting the first gas for the second predetermined period of time. Furthermore, the second predetermined period of time at which the first gas is excited, for example, ranges between 2 and 10 seconds, and is preferably approximately 5 seconds.

As will be understood by one of ordinary skill in the art, the present invention limits the first predetermined period of time at which the substrates are subjected to the first temperature by inserting more than one substrate into the first process chamber prior to establishing the first processing position, thereby decreasing the total amount of time which the substrates are exposed to the first temperature as compared to prior art methods. For example, by inserting two wafers in a consecutive manner as described, the total amount of processing time at the first temperature seen by all wafers in the first chamber is reduced by approximately 50%. If three wafers were inserted in a consecutive manner, the processing time would be decreased by approximately 67%.

Decreasing the amount of time at which the substrates are exposed to higher temperatures is advantageous over the prior art, wherein a growth of hillocks in the first layer is significantly minimized. One skilled in the art will furthermore understand that when the first supports are in the second position, the first and second substrates are disposed above the first heated disk, wherein the substrates can be maintained at a temperature which is substantially lower than the first temperature maintained at the first heated disk. The first temperature at the first heated disk, for example, may be approximately 350° C., whereas the substrates may be subjected to a temperature of 250° C. or lower when in the second position. Such a lower temperature is clearly advantageous, for example, when loading additional substrates (e.g., third and fourth, or fifth and sixth substrates) into the first process chamber.

Subsequent to 410 of FIG. 7A, the method 400 further comprises establishing the first loading position again at 412, wherein the plurality of first supports are raised from the first position to the second position. The method 400 continues at 414, wherein the first substrate and second substrate are consecutively removed from the first process chamber. The first and second substrates are removed from the first process chamber, for example, by rotating the plurality of first supports the first predetermined amount about the first axis, and removing the first substrate on one of the plurality of first supports when the first substrate is at the first loading position. The plurality of first supports are then rotated the first predetermined amount, and the second substrate is removed from another one of the plurality of first supports when the second substrate is at the first loading position. According to another exemplary aspect of the invention, the first and second substrates are moved into a transfer chamber after being removed from the first process chamber (e.g., an in-situ vacuum transfer).

Consecutively inserting and then generally simultaneously processing two or more substrates into the first process chamber is clearly advantageous over prior art methods. Generally simultaneously processing the two or more substrates after the two or more substrates are consecutively inserted into the first process chamber significantly limits a total amount of time at which the two or more substrates are exposed to the, first temperature, thereby advantageously limiting a growth of hillocks in the first layer. Additionally, simultaneously processing two or more substrates improves processing efficiency (e.g., as measured in parts per hour (PPH)), as compared to a conventional methods.

At 416 of FIG. 7A, a second loading position is established in the second process chamber. Again, as illustrated in FIG. 5, the second loading position, for example, is established by raising the plurality of second supports 340 from the third position generally below the second surface 342 of the second disk 325 to the fourth position 343 generally above the second surface. The method 400 of FIG. 7A continues at 418, wherein the first substrate is inserted into the second process chamber. Act 418, for example, comprises placing the first substrate on one of the plurality of second supports. As illustrated in FIG. 6C, for example, act 418 may be performed by placing the first substrate 301A on the first end effector 359A when the first end effector is at a first station 360A in the second process chamber 310. The first station 360A is furthermore considered a second loading location 362 for the second process chamber 310. As illustrated in FIG. 4, the first substrate 301A is placed on the second support 340, for example, via the robot 355. According to one example, the robot 355 moves the first substrate 301A from the transfer chamber 315 into the second process chamber 310 via the second gate valve 311, and places the first substrate on the second support 340 at the second loading location 362.

The plurality of second supports 340 are then rotated (e.g., a clockwise rotation of one-sixth of a revolution) about the first axis 344, wherein the first substrate 301A is translated to the second station 360B. Referring again to FIG. 7B, the method 400 then continues by establishing a second processing position in the second process chamber at 420, wherein, for example, the plurality of second supports are lowered from the fourth position to the third position, and wherein the first substrate contacts the second surface of the second heated disk. Alternatively, the second processing position may be established prior to rotating the plurality of second supports, wherein the rotation is performed after subsequent processing of the substrate.

According to another exemplary aspect of the present invention, the first substrate is processed at 422 of FIG. 7B, wherein a second layer is formed over the first layer by exposure to a second plasma. Processing the first substrate comprises, for example, subjecting the first substrate to a second temperature by thermal conduction from the second disk for a third predetermined period of time. Subjecting the first substrate to the second temperature furthermore comprises a second soak time, wherein the first substrate is allowed to "soak" at the second temperature prior to further processing (e.g., prior to subjecting the first substrate to a plasma). The second soak time, for example, ranges between 2 and 5 seconds, and is preferably approximately 2.5 seconds. Furthermore, the second temperature at which the ranges between 300° C. and 450° C., and is preferably approximately 400° C. According to one aspect of the present invention, processing the substrates at a higher second temperature in the second process chamber than the first temperature in the first process chamber provides further advantages in etch stop properties of the deposited film, as will be understood by one of ordinary skill in the art.

Processing the first substrate at 422 furthermore comprises, for example, introducing a second gas into the second process chamber, and exciting the second gas with a second predetermined power, thereby forming the second plasma for a fourth predetermined period of time. According to one exemplary aspect of the invention, introducing the second gas comprises flowing one or more of silane, ammonia, or nitrogen gases at a second predetermined flow rate. The second gas, for example, may furthermore be flowed into the second process chamber concurrently with the second soak time, however the second gas is generally not excited until the second soak time has elapsed.

The second plasma is formed, for example, by exciting the second gas with a second predetermined power comprising a high frequency power and a low frequency power for the fourth predetermined period of time. The high frequency power, for example, ranges between 500 watts and 800 watts, and is preferably approximately 700 watts. The low frequency power, for example, ranges between 200 watts and 400 watts, and is preferably approximately 300 watts. According to yet another exemplary aspect of the present invention, the second predetermined power remains constant during excitation of the second gas, thus minimizing power transients which may cause antenna or GOI damage, as will be understood by one of ordinary skill in the art. Furthermore, the fourth predetermined period of time at which the second gas is excited, for example, ranges between 2 and 10 seconds, and is preferably approximately 5 seconds. FIG. 8 further illustrates exemplary ranges for various process parameters which may furthermore be utilized in accordance with the present invention.

Subsequent to processing the first substrate at 422, the second loading position is established again at 424. The second substrate is then inserted into the second process chamber at 426. Inserting the second substrate into the second process chamber, for example, comprises placing the second substrate on one of the plurality of second supports at the second loading location, and subsequently rotating the plurality of second supports. For example, as illustrated in FIG. 6D, the second substrate 301B is placed on a second end effector 345B associated with the second process chamber when the second end effector is at the second loading location 362.

Referring again to FIG. 7B, the second processing position is then established again at 428, wherein the plurality of second supports are lowered from the fourth position to the third position. At 430, the first substrate and second substrate are generally simultaneously processed, thereby continuing the formation of the second layer over the first layer on the first substrate and beginning the formation of the second layer over the first layer on the second substrate. The first substrate and second substrate are accordingly processed in a similar manner as the first substrate was processed at 422.

Following the generally simultaneous processing of the first substrate and the second substrate at 430, the second loading position is again established at 432, in a manner similar to 424. The first substrate is then removed from the second process chamber at 434. According to one example, the robot 355 of FIG. 4 removes the first substrate 301A from second support 340 at the second loading location 362 in the second process chamber 310 via the second gate valve 311, and reinserts the first substrate into the cassette 357 in the load lock chamber 358.

Referring once again to FIG. 7B, the second processing position is again established at 436, in a manner similar to 428, wherein the second substrate contacts the second disk. The second substrate is subsequently processed at 438, in a manner similar to 422, wherein the formation of the second layer is continued on the second substrate. Once the second substrate is processed at 438, the second loading position is established again at 440, in a manner similar to 432, and the second substrate is removed from the second process chamber in a manner similar to 434.

As will be understood by one of ordinary skill in the art, the method of the present invention advantageously provides a shorter total soak time (e.g., a total amount of time each substrate spends in contact with the first and second heated disks), and furthermore limits the deleterious transient power effects as mentioned above. For example, consecutively inserting the first and second substrates into the first process chamber and then generally simultaneously processing the first and second substrates generally decreases the total amount of time at which the first and second substrates are subjected to the first temperature by approximately half that of conventional methods. Insofar as conventional methods may process a plurality of substrates in a single process chamber, typically each substrate is inserted and subsequently processed individually, thereby subjecting each substrate to a high processing temperature a number of times equal to the number of substrates inserted into the process chamber. The present invention decreases the total amount of time at which the substrates are exposed to the first temperature by an amount proportional to the number of substrates which are consecutively inserted into the first process chamber, thereby making the present invention clearly advantageous over methods of the prior art.

Although the invention has been shown and described with respect to certain aspects, equivalent alterations and modifications will occur to others skilled in the art upon the reading and understanding of this specification and the annexed drawings. In particular regard to the various functions performed by the above described components (systems, devices, assemblies, etc.), the terms used to describe such components are intended to correspond, unless otherwise indicated, to any component which performs the specified function of the described component (i.e., that is functionally equivalent), even though not structurally equivalent to the disclosed structure that performs the function in the herein illustrated exemplary aspects of the invention. In addition, while a particular feature of the invention may have been disclosed with respect to only one of several aspects, such feature may be combined with one or more other features of the other aspects as may be desired and advantageous for any given or particular application. Furthermore, to the extent that the term "includes" is used in either the detailed description and the claims, such term is intended to be inclusive in a manner similar to the term "comprising."

What is claimed is:

1. A method for improving an interface of a semiconductor device, the method comprising:

providing a first semiconductor substrate and second semiconductor substrate having a first layer formed thereon, wherein the first layer further comprises an oxidized region;

establishing a first loading position in a first process chamber;

consecutively inserting the first substrate and the second substrate into the first process chamber when the first process chamber is in the first loading position;

establishing a first processing position in the first process chamber after consecutively inserting the first substrate and the second substrate;

generally simultaneously processing the first substrate and the second substrate, wherein the oxidized region is chemically reduced by exposure to a first plasma;

establishing the first loading position in the first process chamber after the first substrate and the second substrate are generally simultaneously processed;

consecutively removing the first substrate and the second substrate from the first process chamber;

establishing a second loading position in the second process chamber;

inserting the first substrate into the second process chamber after the first substrate and the second substrate are removed from the first process chamber;

establishing a second processing position in the second process chamber after the first substrate is inserted;

processing the first substrate, wherein a second layer is formed over the first layer by exposure to a second plasma;

establishing the second loading position in the second process chamber after the first substrate is processed;

inserting the second substrate into the second process chamber after the first substrate is processed;

establishing the second processing position in the second process chamber after the second substrate is inserted;

generally simultaneously processing the first substrate and second substrate, wherein the second layer is formed over the first layer by exposure to the second plasma;

establishing the second loading position in the second process chamber after the first substrate and second substrate are generally simultaneously processed;

removing the first substrate from the second process chamber after the first substrate and second substrate are generally simultaneously processed;

establishing the second processing position in the second process chamber after the first substrate is removed;

processing the second substrate after the first substrate is removed, wherein the second layer is formed over the first layer by exposure to the second plasma;

establishing the second loading position in the second process chamber after the first substrate is removed and the second substrate is processed; and removing the second substrate from the second process chamber.

2. The method of claim 1, wherein the first process chamber comprises a first heated disk having a first surface associated therewith, the first process chamber further comprising a plurality of first substrate supports which are vertically moveable between a first position generally below the first surface of the first disk and a second position generally above the first surface of the first disk, and wherein the plurality of first supports are further operable to rotate about a first axis associated therewith.

3. The method of claim 2, wherein establishing the first loading position in the first process chamber comprises raising the plurality of first supports from the first position to the second position.

4. The method of claim 2, wherein consecutively inserting the first substrate and the second substrate into the first process chamber further comprises placing the first substrate and the second substrate on a respective two of the plurality of first supports.

5. The method of claim 4, wherein placing the first substrate and the second substrate on the respective two of the plurality of first supports further comprises:

placing the first substrate on one of the plurality of first supports at a first loading location;

rotating the plurality of first supports a first predetermined amount about the first axis; and placing the second substrate on another one of the plurality of first supports at the first loading location.

6. The method of claim 5, wherein consecutively removing the first substrate and the second substrate from the first process chamber further comprises:

rotating the plurality of first supports the first predetermined amount about the first axis;

removing the first substrate on the one of the plurality of first supports at the first loading location;

rotating the plurality of first supports the first predetermined amount about the first axis after the first substrate is removed; and removing the second substrate on the another one of the plurality of first supports at the first loading location.

7. The method of claim 5, wherein the first predetermined amount is approximately one-sixth of a revolution.

8. The method of claim 2, wherein establishing the first processing position in the first process chamber comprises lowering the plurality of first supports from the second position to the first position, wherein the first substrate and second substrate contact the first surface of the first disk.

9. The method of claim 2, wherein generally simultaneously processing the first substrate and the second substrate further comprises subjecting the first and second substrates to a first temperature by thermal conduction from the first disk for a first predetermined period of time.

10. The method of claim 9, wherein the first temperature ranges between 275° C. and 350° C.

11. The method of claim 10, wherein the first temperature is approximately 350° C.

12. The method of claim 9, wherein the first predetermined period of time comprises a first soak time.

13. The method of claim 12, wherein the first soak time ranges between 2 and 5 seconds.

14. The method of claim 13, wherein the first soak time is approximately 2.5 seconds.

15. The method of claim 12, wherein generally simultaneously processing the first substrate and the second substrate further comprises:

introducing a first gas into the first process chamber; and exciting the first gas with a first predetermined power for a second predetermined period of time after the first soak time has elapsed, thereby forming the first plasma.

16. The method of claim 15, wherein introducing the first gas comprises flowing one or more of a nitrogen or ammonia gases at a first predetermined flow rate.

17. The method of claim 15, wherein the first predetermined power comprises a high frequency power ranging between approximately 500 watts and 700 watts and a low frequency power ranging between approximately 200 watts and 400 watts.

18. The method of claim 17, wherein the first predetermined power the high frequency power is approximately 650 watts and the low frequency power is approximately 200 watts.

19. The method of claim 15, wherein the first predetermined power remains generally constant when the first gas is excited.

20. The method of claim 15, wherein the second predetermined period of time ranges between 2 and 10 seconds.

21. The method of claim 20, wherein the second predetermined period of time is approximately 5 seconds.

22. The method of claim 1, wherein the second process chamber comprises a second heated disk having a second surface associated therewith, the second process chamber further comprising a plurality of second substrate supports which are vertically moveable between a third position generally below the second surface of the second disk and a fourth position generally above the second surface of the second disk, and wherein the plurality of second supports are further operable to rotate about a second axis associated therewith.

23. The method of claim 22, wherein establishing the second loading position in the second process chamber comprises raising the plurality of second supports from the third position to the fourth position.

24. The method of claim 22, wherein inserting the first substrate or the second substrate into the second process chamber further comprises:

placing the respective first substrate or second substrate on one of the plurality of second supports at a second loading location; and rotating the plurality of second supports a second predetermined amount about the second axis.

25. The method of claim 22, wherein the second predetermined amount is approximately one-sixth of a revolution.

26. The method of claim 22, wherein establishing the second processing position comprises lowering the plurality of second supports from the fourth position to the third position, wherein one or more of the first substrate or the second substrate contact the second surface of the second disk.

27. The method of claim 22, wherein processing one or more of the first or second substrates further comprises subjecting one or more of the first or second substrates to a second temperature by thermal conduction from the second disk for a third predetermined period of time.

28. The method of claim 22, wherein the second temperature ranges between 300° C. and 400° C.

29. The method of claim 28, wherein the second temperature is approximately 400° C.

30. The method of claim 22, wherein the third predetermined period of time comprises a second soak time.

31. The method of claim 30, wherein the second soak time ranges between 2 and 5 seconds.

32. The method of claim 31, wherein the second soak time is approximately 2.5 seconds.

33. The method of claim 22, wherein processing one or more of the first or second substrates further comprises:

introducing a second gas into the second process chamber; and exciting the second gas with a second predetermined power for a fourth predetermined period of time after the second soak time has elapsed, thereby forming the second plasma.

34. The method of claim 33, wherein introducing the second gas comprises introducing one or more of silane, ammonia, or nitrogen gases to the substrate.

35. The method of claim 33, wherein the second predetermined power comprises a high frequency power ranging between approximately 500 watts and 800 watts and a low frequency power ranging between approximately 200 watts and 400 watts.

36. The method of claim 35, wherein the second predetermined power comprises a high frequency power of approximately 700 watts and a low frequency power of approximately 300 watts.

37. The method of claim 33, wherein the second predetermined power remains generally constant when the second gas is excited.

38. The method of claim 33, wherein the fourth predetermined period of time ranges between 2 and 10 seconds.

39. The method of claim 38, wherein the fourth predetermined period of time is approximately 5 seconds.

40. The method of claim 1, wherein the first layer comprises a metal layer.

41. The method of claim 40, wherein the metal layer comprises copper, and wherein the oxidized region comprises a copper oxide.

42. The method of claim 1, wherein the first process chamber and the second process chamber each comprise a plasma-enhanced chemical vapor deposition chamber.

43. The method of claim 1, wherein the second layer is a dielectric layer.

44. The method of claim 43, wherein the dielectric layer comprises a nitride layer.

45. The method of claim 1, wherein consecutively removing the first substrate and the second substrate from the first process chamber further comprises moving the first substrate and second substrate into a transfer chamber prior to inserting the first substrate or the second substrate into the second process chamber.

46. The method of claim 45, wherein moving the first substrate and second substrate into the transfer chamber comprises an in-situ vacuum transfer.

47. A method for improving an interface of a semiconductor device, the method comprising:

providing a first semiconductor substrate and second semiconductor substrate having a first layer formed thereon, wherein the first layer further comprises an oxidized region;

inserting the first substrate into a first process chamber, wherein the first process chamber comprises a first heated disk having a first surface associated therewith, the first process chamber further comprising a plurality of first substrate supports which are vertically moveable and are operable to rotate about a first axis, wherein inserting the first substrate into the first process chamber further comprises:

raising the plurality of first supports from a first position generally below the first surface of the first disk to a second position generally above the first surface of the first disk; and placing the first substrate on one of the plurality of first supports;

rotating the plurality of first supports a first predetermined amount;

inserting the second substrate into the first process chamber, wherein the second substrate is placed on another one of the plurality of first supports;

lowering the plurality of first supports from the second position to the first position, wherein the first substrate and second substrate contact the first surface of the first disk;

subjecting the first and second substrates to a first temperature in the first process chamber for a first predetermined period of time;

introducing a first plasma to the first and second substrates in the first process chamber, wherein the first plasma is energized by a first predetermined power for a second predetermined period of time, wherein the oxidized region is chemically reduced by exposure to the first plasma;

raising the plurality of first supports from the first position to the second position;

rotating the plurality of first supports the first predetermined amount;

removing the first substrate from the first process chamber to a generally isolated environment;

rotating the plurality of first supports the first predetermined amount;

removing the second substrate from the first process chamber to the generally isolated environment;

inserting the first substrate into the second process chamber, wherein the second process chamber comprises a second heated disk having a second surface associated therewith, the second process chamber further comprising a plurality of second substrate supports which are vertically moveable and are operable to rotate about a second axis, wherein inserting the first substrate into the second process chamber further comprises:

raising the plurality of second supports from a third position generally below the second surface of the second disk to a fourth position generally above the second surface of the second disk; and placing the first substrate on one of the plurality of second supports;

lowering the plurality of second supports from the fourth position to the third position, wherein the first substrate contacts the second surface of the second disk;

subjecting the first substrate to a second temperature in the second process chamber for a third predetermined period of time;

introducing a second plasma to the first substrate in the second process chamber, wherein the second plasma is energized by a second predetermined power for a fourth predetermined period of time, wherein a second layer is formed over the first layer by exposure to the second plasma;

raising the plurality of second supports from the third position to the fourth position;

rotating the plurality of second supports the second predetermined amount;

inserting the second substrate into the second process chamber, wherein the second substrate is placed on another one of the plurality of second supports;

lowering the plurality of second supports from the fourth position to the third position, wherein the first substrate and second substrate contact the second surface of the second disk;

subjecting the first and second substrates to the second temperature in the second process chamber for the third predetermined period of time;

introducing the second plasma to the first and second substrates in the second process chamber for the fourth predetermined period of time, wherein the second layer is formed over the first layer by exposure to the second plasma;

raising the plurality of second supports from the third position to the fourth position;

rotating the plurality of second supports the second predetermined amount;

removing the first substrate from the second process chamber;

lowering the plurality of second supports from the fourth position to the third position, wherein the second substrate contacts the second surface of the second disk;

subjecting the second substrate to the second temperature in the second process chamber for the third predetermined period of time;

introducing the second plasma to the second substrate in the second process chamber for the fourth predetermined period of time, wherein the second layer is formed over the first layer by exposure to the second plasma;

raising the plurality of second supports from the third position to the fourth position;

rotating the plurality of second supports the second predetermined amount; and removing the second substrate from the second process chamber.

* * * * *